United States Patent [19]

Knopp

[11] Patent Number: 5,758,412
[45] Date of Patent: Jun. 2, 1998

[54] METHOD OF MAKING A PRINTED CIRCUIT BOARD

[75] Inventor: John Frederick Knopp, Braintree, United Kingdom

[73] Assignee: MacDermid, Incorporated, Waterbury, Conn.

[21] Appl. No.: 730,572

[22] PCT Filed: Jun. 1, 1993

[86] PCT No.: PCT/GB93/01152

§ 371 Date: Dec. 9, 1994

§ 102(e) Date: Dec. 9, 1994

[87] PCT Pub. No.: WO93/26145

PCT Pub. Date: Dec. 23, 1993

Related U.S. Application Data

[63] Continuation of Ser. No. 607,653, Feb. 27, 1996, abandoned, which is a continuation of Ser. No. 351,356, filed as PCT/GB93/01152, Jun. 1, 1993 published as WO93/26145, Dec. 23, 1993, abandoned.

[30] Foreign Application Priority Data

Jun. 11, 1992 [GB] United Kingdom ............... 9212395
Dec. 11, 1992 [GB] United Kingdom ............... 9225895
Dec. 3, 1993 [GB] United Kingdom ............... 9324848

[51] Int. Cl.$^6$ ........................................ H05K 3/42
[52] U.S. Cl. ................ 29/852; 29/DIG. 12; 427/97; 427/98
[58] Field of Search ............... 29/846, 852, DIG. 12; 427/96, 97, 98; 430/313, 314

[56] References Cited

U.S. PATENT DOCUMENTS

| | | | |
|---|---|---|---|
| 4,574,031 | 3/1986 | Dorey, II et al. | 427/96 X |
| 4,605,471 | 8/1986 | Mitchell | 29/852 X |
| 4,782,007 | 11/1988 | Ferrier | 427/98 X |
| 5,218,761 | 6/1993 | Maniwa et al. | 29/852 |

FOREIGN PATENT DOCUMENTS 1056814 6/1963 United Kingdom.

*Primary Examiner*—Peter Vo
*Attorney, Agent, or Firm*—John L. Cordani

[57] ABSTRACT

A method of making a plate through hole printed circuit board, comprises the steps of: a) forming conductive circuit elements on two opposed faces of a non-conductive substrate; b) coating the substrate and circuit elements with a de-sensitising material; c) forming holes through the substrate, each hole passing through a circuit element on each of the opposed faces of the board; d) treating the board to render the substrate exposed in the holes receptive to the action of a metallic plating solution; e) removing the de-sensitising material; and f) treating the board with a metallic plating solution to deposit conductive metal in the holes to the desired thickness to provide an electrical connection through each hole between two opposed conductive circuit elements. This may be in two stages, with an initial thin layer of copper being deposited, followed by a main layer of nickel to the desired thickness.

4 Claims, 2 Drawing Sheets

METHOD OF MAKING A PRINTED CIRCUIT BOARD

This application is a continuation of application Ser. No. 08/607,653, filed Feb. 27,1996, now abandoned, which is a continuation of application Ser. No. 08/351,356, filed as PCT/GB93/01152, Jun. 1, 1993, published as WO93/26145, Dec. 23, 1993.

FIELD OF THE INVENTION

This invention relates to a method of making a printed circuit board of the plate through hole type.

Plate through hole (PTH) boards have conductive circuit elements formed on both sides and interconnected by holes drilled through the board from a conductive element on one side to an opposed element on the other side, the holes having copper or other conductive metal plated therethrough.

BACKGROUND TO THE INVENTION

Conventionally, PTH boards are manufactured by a process of the type in which holes are first drilled in the correct locations through a substrate with copper coated on both sides, and the board is then given an initial treatment with an electroless copper plating solution after preparation. A negative resist image of the circuit elements is then formed by a conventional imaging process, which is followed by an electroplating step. The copper areas are protected by an application of tin, or possibly gold, and then the resist is removed. Etching of the exposed copper areas can now take place. Finally, the tin or gold is removed, leaving the required printed circuit board.

The conventional process has the following disadvantages:

1) Copper is plated over the existing copper across the whole plate at the same time as the plating in the holes. It is therefore usual to start with a substrate having copper layers thinner than required for the eventual conductive tracks and to attempt to build up to the required thickness during the plating processes. The result is typically a wide variation in track thickness, possibly leading to difficulties with subsequent treatment stages or to excessive track resistance locally. Further, the electroplating is costly, increasing the board cost, and can give rise to inadequate bonding of the plated copper, leading to delamination in subsequent processing or in use, again leading to localised high resistance of the tracks.

2) The initial electroless plating is not conducted for a sufficient time to build a continuous layer, and this can cause the creation of voids during electroplating. These voids can contain some of the plating solution which, during subsequent soldering operations, can boil, causing failure of the copper plating in the hole. This is referred to as "outgassing".

3) The imaging processing to form the conductive tracks is carried out after the formation of the holes, and this can lead to contamination of the surface in the holes before the electroplating. This can again cause outgassing or lead to an inadequate connection through the holes.

4) Since the imaging is carried out after the holes have been made through the board, and because a negative resist image is required, the use of screen printing is not practical, and dry film techniques are typically used. These are relatively complex and costly, and require solvent treatment to remove the dry film.

5) Two etching stages are required, creating metal-bearing waste requiring treatment.

6) The capital cost of the equipment is high, as is the energy cost for operating it. The resultant cost of manufacturing boards is high, often unacceptably so.

GB-A-1 056 814 discloses a process for making a plate through hole printed circuit board in which the circuit elements can be formed on the opposed faces of the board, and a de-sensitizing etch resist is coated over the board. The holes are drilled or punched through, and a sensitizing bath is then used to treat the exposed surfaces in the hole, followed by removal of the resist layer, for example by dissolving it in a solvent. Electroless plating then follows.

SUMMARY OF THE INVENTION

The present invention provides a method of making a plate through hole printed circuit board, comprising the steps of:

a) forming conductive circuit elements on two opposed faces of a non-conductive substrate;

b) coating the substrate and circuit elements with a de-sensitising material;

c) forming holes through the substrate, each hole passing through a circuit element on each of the opposed faces of the board;

d) treating the board to render the substrate exposed in the holes receptive to the action of a metallic plating solution;

e) removing the de-sensitizing material; and f) treating the board with an electroless metallic plating solution to deposit conductive metal in the holes to the desired thickness to provide an electrical connection through each hole between two opposed conductive circuit elements, characterised in that the de-sensitizing material is an alkali-strippable material, and in that step (e) comprises treating the board with an alkaline accelerator solution to accelerate the action of the sensitization and simultaneously to remove the de-sensitizing material.

Preferably, the de-sensitizing material is a plating resist coating material. The conductive metal may be copper, but it has been found especially advantageous to plate nickel. This may suitably be plated over an initial thin layer of copper, and provides a very strong, durable and corrosion-resistant board. Other metals, such as palladium or tin, may also be employed in accordance with the invention, and combinations of metal layers may also advantageously be employed. The electroless metallic plating solution is preferably of the general sort conventionally used in the manufacture of printed circuit boards. A non-homogeneous plating solution, which will only plate on to areas sensitised or treated to render them receptive to the plating, is preferred. Such sensitizing typically deposits a catalyst on to a cleaned and micro-etched surface to initiate the deposition of metal from its solution. The thickness of the metal plated on to the substrate in the holes is comparable with that achieved with the conventional method using electroplating. The method may be applied to any printed circuit board substrate.

In comparison with conventionally produced boards, boards produced by the method of the invention are consistent in quality, and in uniformity of plating through the holes. Since metal is not built up equally over the whole board during plating, but is concentrated on the holes, with a lesser build-up on metal areas connected to the holes, the initial metal coating on the substrate can be selected to be the design conductor thickness, thus ensuring that all tracks meet the design specification. The use of a single electroless plating operation before imaging ensures that no voids are present which might give rise to outgassing, and contamination cannot occur. Further, although plating in the holes may not proceed uniformly initially, because of the variation in the surface smoothness in the drilled hole, the resultant lack of smoothness in the surface of the plated metal through the hole is advantageous in providing a key for the solder in the subsequent use of the board. Electroplated copper, on the other hand, tends to be very smooth at its surface, and therefore to be more difficult to bond the solder to. The imaging of the conductive tracks is carried out before the holes are drilled, and involve the formation of a positive resist image. This means that screen printing of an alkali-strippable resist can be used. This is not only a very low-cost operation, but requires only treatment in the alkaline accelerator solution to remove the resist at the end of processing. Such treatment does not give rise to difficulties in waste treatment, requiring no organic solvents.

The method of the invention uses only one, or at the most two plating baths, for example for copper and nickel, and only one etching bath, reducing cost and the problems associated with treatment of waste from the plating and etching stages. Capital costs and running costs are substantially smaller than with the conventional process. Control of the plating process is simple and a high degree of precision in achieving design plating thicknesses can be expected. It has been found that currently-available high build rate nickel plating solutions do not "strike" satisfactorily to the bare board surface in the holes, and an initial coating of copper, or possibly of nickel (or of another metal) from a different type of plating solution, may be needed to ensure even plating. An initial starter layer of about 2 μm of copper or other metal will generally be sufficient, and although the initial plating rate is slower, the thinness of the initial layer does not impose too great a time penalty.

A further benefit of the process of the invention when plating with copper, arising through the use of a non-homogeneous plating system, is that the non-plated areas tend to tarnish slightly during the plating process, while the newly-plated areas exhibit bright metal. As the areas of copper electrically connected to the holes are also plated in the electroless plating bath, the action of the bath depending on an electrochemical reaction, even though not externally driven, any hole in which plating is unsatisfactory can immediately be seen on visual inspection of the plate since its connected areas of conductive track will have been tarnished in the plating bath.

Still further benefits arise from the use of electroless nickel plating solutions to deposit conductive metal in the holes. Firstly, plating rates are very much higher than for copper solutions, typically around 25 μm/hr, so that a satisfactory thickness of metal can be built up in a much shorter time. Secondly, since nickel does not tarnish in the way that copper does, it is no longer necessary to coat the exposed copper on the board with solder. This is conventionally done in a hot-air levelling process, involving dipping the board into a bath of solder and then removing excess solder and levelling by means of a jet of hot air. This process is costly and potentially dangerous, and can give rise to health risks due to metal vapour emissions. Thirdly, electroless nickel plating does not require the presence of the formaldehyde required for copper plating. Since formaldehyde is carcinogenic, its avoidance is very desirable. Finally, boards plated through the holes with nickel in accordance with the invention have been found to meet the highest quality standards, rendering them suitable for use in space and aerospace applications, while production costs are comparable with conventional standard production boards.

DETAILED DESCRIPTION OF THE PRIOR ART METHOD

Figure 1A:
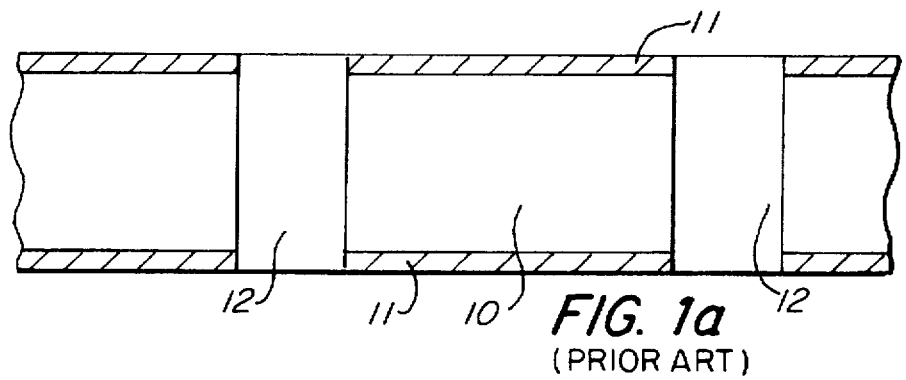
FIGS. 1a to 1d are enlarged diagrammatic sectional views through a board at different stages in a manufacturing process according to the prior art.

Referring first to FIG. 1a, a circuit board substrate 10, for example of glass-reinforced plastics, has a copper layer 11 on each face thereof. The first step in the conventional method is to drill holes 12 through it at positions where the eventual interconnections between the opposed circuits are to be located.

Figure 1B:
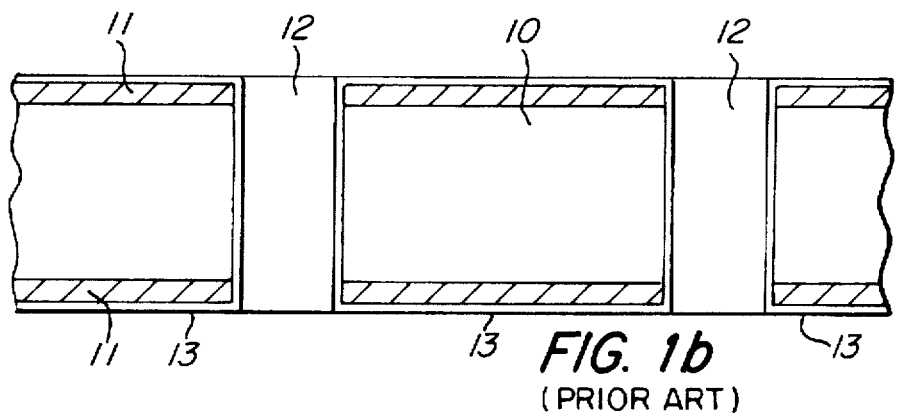

The board is then prepared by cleaning and sensitizing for receipt of a coating of copper from an electroless copper plating solution. The thin (e.g. about 2.5 mm) layer 13 produced by treatment for about one hour in the solution extends over the copper layers 11 and the exposed surfaces of the substrate in the holes 12, as can be seen from FIG. 1b.

Figure 1C:
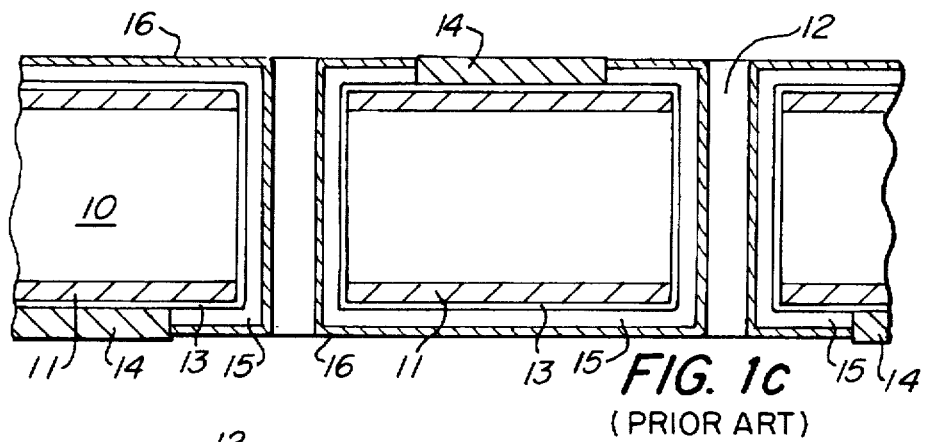
Figure 1D:
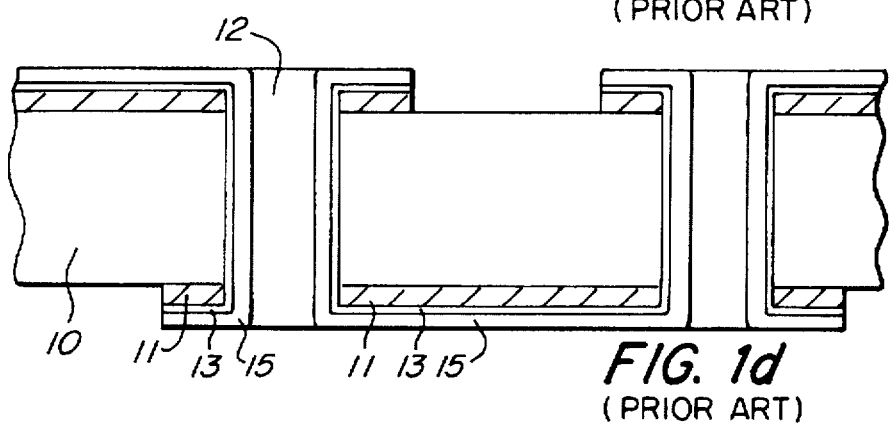

A negative resist image 14 of the desired circuit elements is then formed on each surface of the board (FIG. 1c), and further copper 15 is electroplated on to the exposed areas on the opposed surfaces and through the holes. A layer 16 of tin (or other differentially-etchable metal) is then plated on to the copper by electroplating or electroless plating, to protect the copper during differential etching, which is carried out after removal of the resist image 14. Finally, the tin is removed from the board by another differential etching process to yield the completed board illustrated in FIG. 1d. It will be seen that the thickness of the original copper layers 11 is increased both by the electroless and electroplating processes whose aim is to introduce copper through the holes to provide the interconnections. Additionally, the electroplating process tends to build copper preferentially away from the centres of the holes, resulting in an uneven thickness through the holes. Furthermore, the thickness of plating varies across the surface of the board.

DETAILED DESCRIPTION OF THE ILLUSTRATED METHOD OF THE INVENTION

Figure 2A:
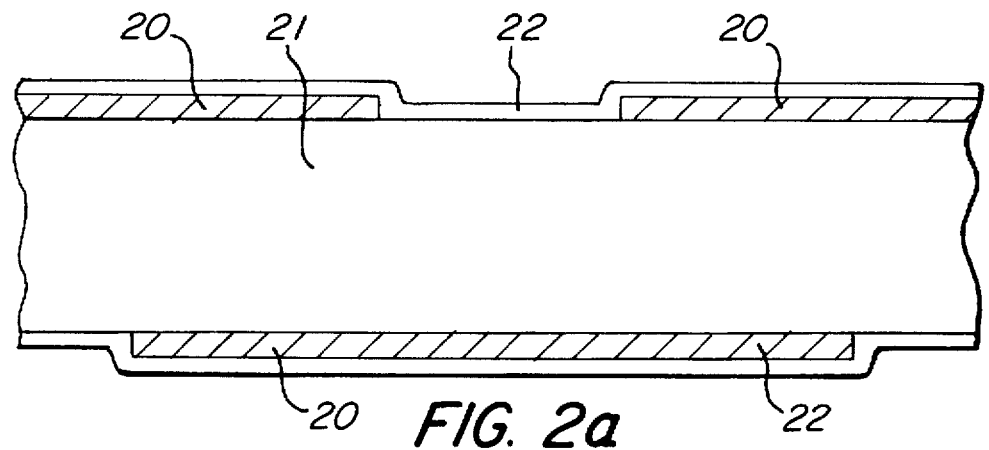
FIGS. 2a to 2c are similar diagrammatic views illustrating stages in a manufacturing process according to the present invention.

Referring now to FIG. 2a, the method of the invention comprises as a first step the formation of the conductive circuit elements 20 on each surface of the substrate 21 by the conventional processes of forming a positive resist image, for example by silk screen printing, or photographically, and etching away the copper from the exposed parts of the board. A uniform coating 22 of an alkali-soluble plating resist is then applied to each surface of the board by silk screen printing or dry film application as a de-sensitizing layer, and is cured, for example by the application of U.V. light.

Figure 2B:
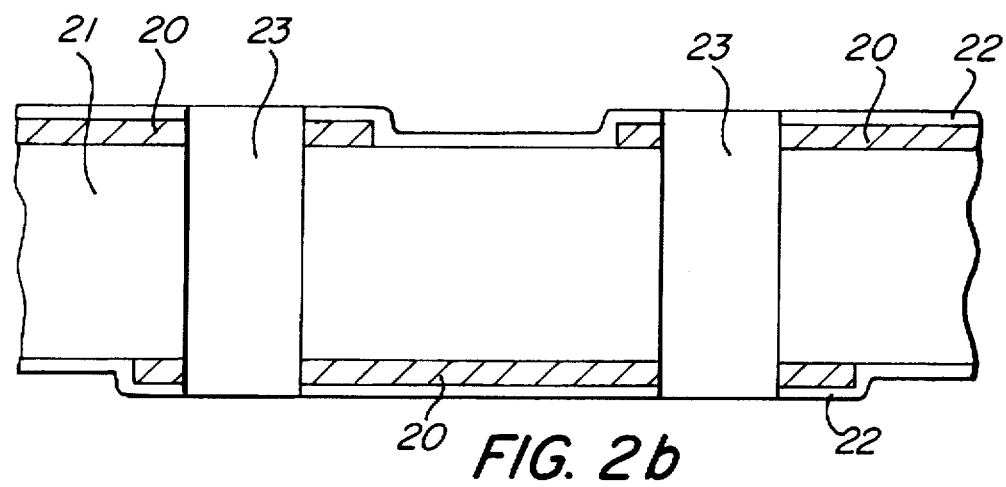

Holes 23 are then drilled through the board and the de-sensitizing layer at the desired locations for interconnections between opposed circuit elements 20, yielding a configuration as shown in FIG. 2b. Treatment of the exposed substrate in the holes to render it receptive to electroless plating of copper is then carried out in conventional manner, with initial cleaning, micro-etching and sensitizing with any of the known electroless preparatory systems, for example the materials sold by MacDermid GB Ltd under reference 9027. The final stage in preparation is treatment by caustic soda as an accelerator, and this also has the effect of stripping off the de-sensitizing resist layer 22.

Figure 2C:
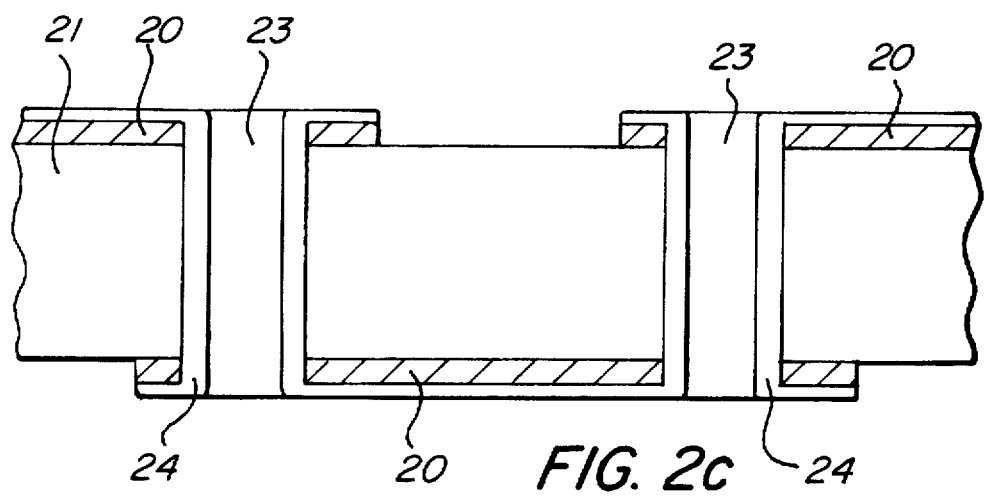

Since the only area of the board prepared for plating of copper is the exposed surface within the holes 23, treatment of the board in a strong electroless copper plating solution, e.g. that included in MacDermid GB Ltd's system reference 9027, for a prolonged period, suitably of the order of 20 hours, builds up copper to the desired thickness in the holes, with approximately 50% build up on the connected circuit elements. This leaves the configuration illustrated in FIG. 2c. It is observed that the thickness of copper 24 through the holes is generally uniform, and consistent across the area of the board, the plating of copper being less subject to the faults which can arise in the conventional electroplating techniques.

Control of the electroless plating stage is conveniently achieved as follows. The boards are suspended in a tank of the plating solution, which is non-homogeneous and suitably circulated through an overflow tank, where it can be filtered, so as to maintain a constant volume in the plating tank. Air is bubbled through the plating tank to agitate the solution and ensure adequate mixing, and the supports for the boards are oscillated to ensure that fresh solution is constantly passed through the holes. The plating solution is replenished from a measured supply by a dosing pump or pumps, which operate at a constant predetermined rate, but which are controlled to switch on and off repeatedly so as to run for a set percentage of the total plating time. This is determined according to the amount of copper to be deposited.

By way of example only, the plating tank is suitably run for 20 hours, so as to operate overnight. It is assumed that a maximum of 200 square feet of plating area is to be plated to a thickness of 20 microns over the 20 hours. The concentration of the replenishing solution is such that 20 litres will need to be added over the 20 hours. This is taken to be a 100% load. A formula:

$$\% \text{ dosing} = \frac{\text{Batch area to be plated}}{200} \times \frac{\text{Required thickness}}{20} \times 100$$

can thus be used to set the proportion of time the pumps are run for. Thus, if 232 panels or boards, each having 0.37 square feet of plating to a thickness of 25 microns, are to be plated, the area of the batch is 232×0.37=85.84 square feet. Putting this into the formula gives:

$$\frac{85.84}{200} \times \frac{25}{20} \times 100 = 53.65\%$$

Thus, the pump control meter is set to 54%, and the volume of replenishing solution can be calculated as 54% of 20 litres=10.8 litres. The final control of the operation is thus by the volume of replenishing solution actually used. This can be measured, for example by drawing it from a graduated vessel, and when the required volume has been delivered with the pumps operating for 54% of each minute, the dosage pumps can be switched off and the boards removed. The controlling factor is thus volume of copper solution used and not the running time, which is standardised at about 20 hours for convenience. It has been found that plating for this length of time produces a satisfactory plating density.

It will be appreciated that when plating with electroless nickel solution in accordance with a preferred aspect of the invention, the plating times will generally be substantially shorter than for copper, for example of the order of one hour, and therefore the control of the plating process will be adapted accordingly.

I claim:

1. A method of making a printed circuit board, said method comprising the following steps performed in the order given:

a). forming conductive circuit elements on two opposed faces of a non-conductive substrate;

b). coating the substrate and circuit elements with a desensitizing material;

c). forming holes through the substrate, each hole passing through a circuit element on each of the opposed faces of the board;

d). treatment of the holes to render the hole walls receptive to plating;

e). removing the desensitizing material; and f). plating the circuit elements and the hole walls with a first plating solution such that a starter layer of about two microns in thickness is created upon the circuit elements and the hole walls and thereafter plating upon said starter layer using an electroless nickel plating solution.

2. The method according to claim 1 wherein step (d) comprises subjecting the board to the following treatments:

i) cleaning;

ii) sensitization; and iii) acceleration in an alkaline accelerator.

3. The method according to claim 1 wherein step (a) comprises:

i) applying an etch resist to the faces of a copper clad laminate in a positive image of the circuitry;

ii) etching away the exposed copper; and iii) stripping away the etch resist.

4. A method of making a printed circuit board, said method comprising the following steps, performed in the order given:

a) forming conductive circuit elements on two opposed faces of a non-conductive substrate;

b) coating the substrate and circuit elements with a desensitizing material;

c) forming holes through the substrate, each hole passing through a circuit element on each of the opposed faces of the board;

d) subjecting the board to the following treatments:
   1. cleaning;
   2. sensitizing;
   3. acceleration in an alkaline accelerator wherein the desensitizing material is removed from the board; and e). plating the circuit elements and the hole walls with a first plating solution such that a starter layer of about two microns in thickness is created upon the circuit elements and the hole walls and thereafter plating upon said starter layer using an electroless nickel plating solution.

* * * * *